United States Patent
Hanika et al.

(10) Patent No.: US 8,083,911 B2
(45) Date of Patent: Dec. 27, 2011

(54) APPARATUS FOR TREATING A SUBSTRATE

(75) Inventors: Markus Hanika, Landsberg (DE); Tobias Stolley, Frankfurt (DE)

(73) Assignee: Applied Materials, Inc., Santa Clara, CA (US)

( * ) Notice: Subject to any disclaimer, the term of this patent is extended or adjusted under 35 U.S.C. 154(b) by 811 days.

(21) Appl. No.: 12/031,339

(22) Filed: Feb. 14, 2008

(65) Prior Publication Data
US 2009/0205954 A1    Aug. 20, 2009

(51) Int. Cl.
*C23C 14/36*    (2006.01)
(52) U.S. Cl. .......... 204/298.08; 204/298.26; 204/298.14
(58) Field of Classification Search ............. 204/298.08, 204/298.26, 298.14
See application file for complete search history.

(56) References Cited

U.S. PATENT DOCUMENTS

| | | | |
|---|---|---|---|
| 4,417,968 A | 11/1983 | McKelvey | |
| 5,126,032 A * | 6/1992 | Szczyrbowski et al. . | 204/298.08 |
| 5,415,757 A | 5/1995 | Szcyrbowski et al. | |
| 5,645,699 A * | 7/1997 | Sieck ..................... | 204/192.12 |
| 6,093,293 A | 7/2000 | Haag et al. | |
| 6,284,106 B1 | 9/2001 | Haag et al. | |
| 6,454,920 B1 | 9/2002 | Haag et al. | |
| 2006/0221540 A1 | 10/2006 | Himori et al. | |
| 2008/0000768 A1 | 1/2008 | Stimson | |

FOREIGN PATENT DOCUMENTS

| | | |
|---|---|---|
| DE | 40 42 289 A1 | 12/1990 |
| DE | 41 36 655 A1 | 11/1991 |
| DE | 4042289 A1 | 7/1992 |
| DE | 4136655 | 5/1993 |
| DE | 19701575 A1 | 7/1998 |
| EP | 1594153 A1 | 5/2004 |
| EP | 1594153 A1 | 11/2005 |
| EP | 1722005 B1 | 11/2006 |
| JP | 5-222530 | 8/1993 |
| JP | 06002123 | 1/1994 |
| JP | 2001026878 | 1/2001 |
| JP | 2003183829 | 7/2003 |
| WO | WO 2005/052979 A2 | 11/2004 |

* cited by examiner

*Primary Examiner* — Keith Hendricks
*Assistant Examiner* — Jason M Berman
(74) *Attorney, Agent, or Firm* — Cooley LLP

(57) ABSTRACT

This invention relates to an apparatus (1) for treating, e.g. coating, a substrate (35, 39) in a vacuum chamber (2). In this vacuum chamber (2) there are arranged n cathodes (7-10) and n+1 anodes (28-32), each of said anodes adjacent to a cathode (7-10). Each of the n cathodes (7-10) and n of the assigned anodes (29-32) are connected to a power supply (11-14). One of the anodes (28) not being assigned to a cathode (7-10) is connected to an electrical line (63) which is connecting each of the anodes (28-32). A pull-down resistor (34) is connected to said line (63) at its one end and to ground (33) at its other end.

12 Claims, 4 Drawing Sheets

APPARATUS FOR TREATING A SUBSTRATE

FIELD OF THE INVENTION

This invention relates to an apparatus for treating a substrate.

BACKGROUND OF THE INVENTION

Magnetron sputtering sources are used for treating, e.g. coating, a substrate, such as semiconductors, optical devices or flat panel displays. By such magnetron sources ions of a plasma are caused to sputter material from a target. This sputtered target material is then deposited on a surface of said substrate in order to form a thin film. Also, the ions may etch the substrate.

A sputter source having at least two electrically isolated stationary bar-shaped target arrangements mounted one alongside the other and separated by respective slits is already known (U.S. Pat. No. 6,093,293, see also U.S. Pat. No. 6,284,106 and U.S. Pat. No. 6,454,920). Each of the target arrangements includes a respective electric pad so that each target arrangement may be operated electrically independently from the other target arrangement. Each target arrangement also has a controlled magnet arrangement for generating a time-varying magnetron field upon the respective target arrangement. The sputter source further has an anode arrangement with anodes alongside and between the target arrangements and/or along smaller sides of the target arrangements.

Further, an arrangement for coating a substrate is known, which comprises two electrodes being electrically separated from a sputtering chamber and from each other, wherein one of the electrodes is a cathode being electrically connected with the target and wherein the other electrode is an anode (DE 40 42 289 A1). A capacitor and a resistor are connected in series to said anode and to ground. According to DE 41 36 655 A1 the capacitor can be omitted. In both documents (DE 40 42 289 A1 and DE 41 36 655 A1) the problem to be solved is to suppress an arc discharge.

If the anodes, as shown in DE 41 36 655 A1 are arranged in front of the cathode, the conditions of ignition are improved. However, the disadvantage occurs that the anodes are a hindrance for the current of plasma particles whereby the anodes are coated, too. This coating, in turn, leads to the result that particles of the anode can fall on the substrate and worsen the quality of the layer. On the other hand, with reactive sputtering, the surfaces of the anodes opposite to the surfaces of the cathodes may be coated with dielectric substances. As a result, the ignition conditions are worsened. This effect is known as the "disappearing anode".

Still, a plasma source including a chamber for confining a feed gas is known (WO 2005/052979 A2). An anode is positioned in said chamber, and a segmented magnetron cathode comprising a plurality of magnetron cathode segments is positioned in the chamber proximate to the anode.

Finally, a plurality, i.e. more than two cathodes arranged in a chamber are known from U.S. Pat. No. 4,417,968, JP 2003-183829 and EP 1 594 153 A1.

It is an object of the present invention to provide an arrangement for coating a substrate, for instance glass, whereby the coating process has a long-term stability, so that the layers which are deposited on different substrates do not differ substantially from each other.

SUMMARY OF THE INVENTION

This problem is solved by providing an apparatus for coating a substrate according to the features of claim 1.

This invention therefore relates to an apparatus for treating, e.g. coating, a substrate in a vacuum chamber. In this vacuum chamber there are arranged n cathodes and n+1 anodes, each of said anodes adjacent to a cathode. Each of the n cathodes and n of the assigned anodes are connected to a power supply. One of the anodes not being assigned to a cathode is connected to an electrical line which is connecting each of the anodes. A pull-down resistor is connected to said line at its one end and to ground at its other end.

Employing this arrangement in a sputtering process, the layers of the coated substrates have a good stability over a long period of time. Furthermore, the characteristics of the layer, e.g. the sheet resistance and the sheet uniformity, are improved.

Very good properties are obtained at a resistance value beyond 10Ω or more. For instance, if the pull-down resistor has a resistance value of 440-470Ω good characteristics are obtained for a substrate's coating, the substrate being coated with an apparatus having three or more, e.g. nine, magnetron sputter sources.

BRIEF DESCRIPTION OF THE DRAWINGS

The present invention will be better understood and its various objects and advantages will be more fully appreciated from the following description taken in conjunction with the accompanying drawings, in which.

DETAILED DESCRIPTION

Figure 1:
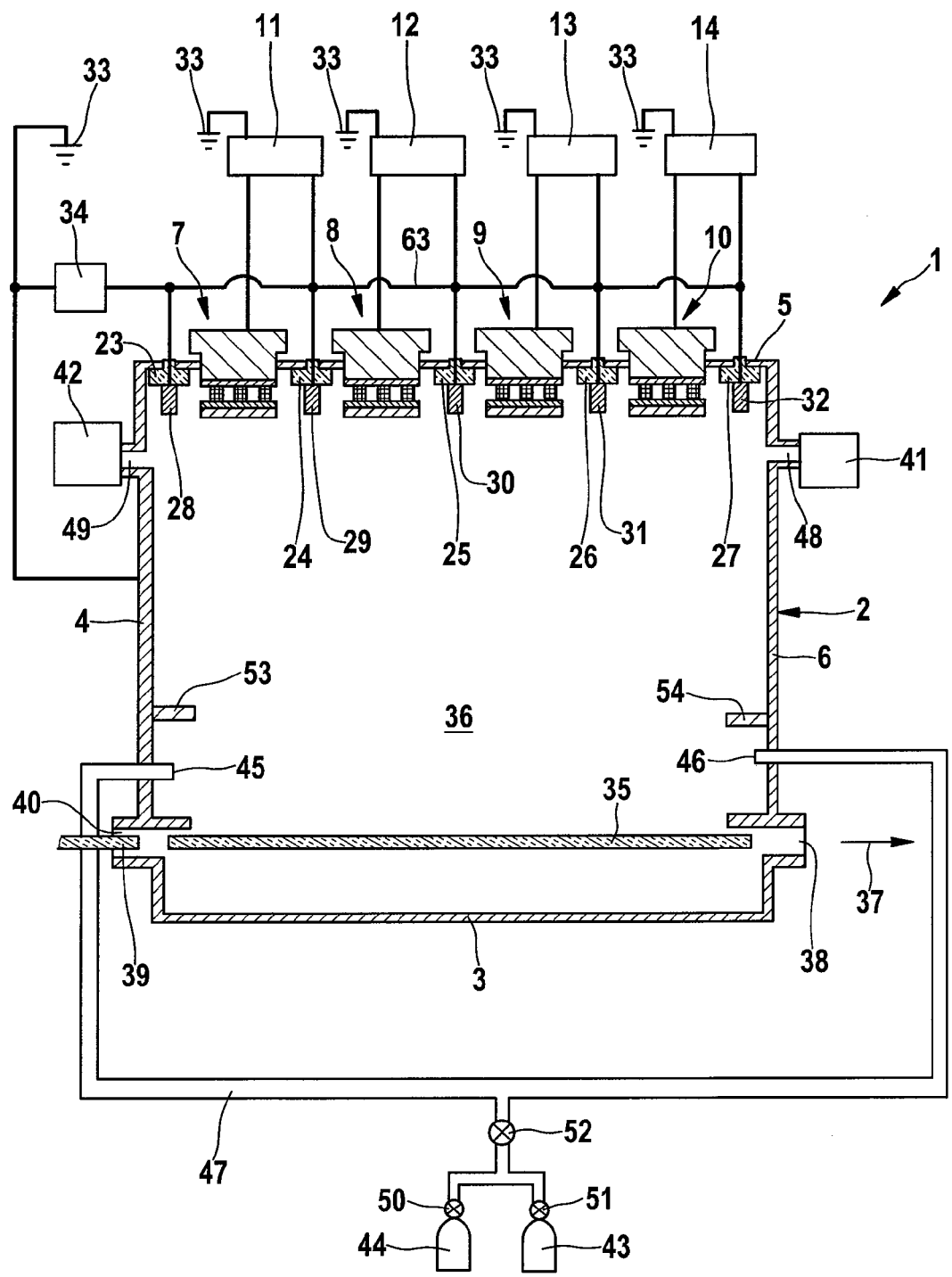
FIG. 1 is a cross section view of an apparatus for coating a substrate, said apparatus comprising linear cathodes.

FIG. 1 shows a cross section view of an apparatus 1 for coating a substrate. This apparatus 1 comprises a vacuum chamber 2 having surrounding walls 3, 4, 5, 6 and a plurality of cathode arrangements 7 to 10. Each of the cathode arrangements 7 to 10 is connected to one of the power supplies 11 to 14 thus establishing a cathode. Anodes 28 to 32 are arranged in the neighborhood of the cathode arrangements 7 to 10 and connected via lines to the power supplies. These lines pass the wall 5 through isolators 23 to 27. The anodes 29 to 32 are connected to one of the power supplies 11 to 14 so that each power supply is connected to one of the anodes 29 to 32 and one of the cathode arrangements 7 to 10. All of these power supplies 11 to 14 are electrically connected to ground 33 serving as protective earth.

The resistance between the anodes 28 to 32 and the supplying lines is about 100-200 mΩ. If the resistance of resistor 34 is lower than 2Ω, a greater current will flow to the shrouds 53, 54, because the transition resistance of the shrouds 53, 54 is low. If resistor 34 is by-passed by a short circuit (R=0) then all surfaces of the sputter chamber 2 have the function of anodes. Such a big anode would have the advantage that the ignition of the plasma is improved. However, by an arrangement comprising a plurality of cathodes 7 to 10 an electrical field would establish which is defined by earthed metallic parts which determine the unevenness of the layer.

The resistor 34 is in the present invention used to eliminate the influence of earthed parts of the chamber 2 on an arrangement comprising a plurality of cathodes.

If the resistance of the resistor 34 increases, the influence of the earthed parts is more and more eliminated after ignition of the plasma, because after ignition the plasma current flows in particular between the anodes 28 to 32 and cathodes 7 to 10. At the moment of ignition a small current is flowing so that the voltage of resistor 34 is low. If, however, with a constant burning plasma a big current is flowing, the voltage of resistor 34 will increase. Thus, the earthed parts of the chamber 1 are substantially separated from the sputter current circuit. When R=∞ the current is flowing between the anodes and the cathodes only.

As can be seen from FIG. 1 there are five anodes 28 to 32 arranged in the chamber 2, but only four cathodes or target arrangements 7 to 10, each of them comprising a cathode, or, generally speaking, n+1 anodes and n cathodes. However, the amount of cathodes can also be equal to the amount of anodes.

By having such an arrangement comprising n+1 anodes and n cathodes a geometrical and electrical mirror symmetry is established with regard to the substrate being moved through the chamber.

The anodes 28 to 32 are electrically connected to each other via a line 63 and also connected via the resistor 34 to ground 33, so that all anodes 28 to 32 are connected to a common electrical potential.

Resistor 34 is a pull-down resistor having a defined resistance, the resistance value being beyond 2Ω up to several kΩ, preferably up to 1 MΩ. With this defined resistance value it is possible to set a defined potential comprising power supply, anode and cathode establishing a homogenous distribution of plasma inside the chamber 2. As a result, a uniform coating of a substrate is obtained.

If the resistance value of the resistor 34 is lower than 2Ω the current does not fully flow through the anodes 28 to 32. To avoid this, resistor 34 has a resistance value beyond 2Ω, preferably beyond 10Ω, so that the current flows through the anodes 28 to 32. At a resistance value of 2Ω or more the coated sheet resistance value is independent from the current and the voltage.

Without pull-down resistor 34 the afore-mentioned potential values would not have defined values with respect to earth or ground. Thus the potential could correspond to R=0 at one time and to R≠0 at another time. There would be no guarantee for a homogenous distribution of the plasma, i.e. the distribution of the coating would be good at one moment and bad at another moment. Also the long-term stability could not be controlled.

Referring again to FIG. 1, a plane substrate 35 is illustrated, e.g. a glass plate, moving through the interior 36 of the vacuum chamber 2, said substrate 35 being coated as it passes the cathode arrangements 7 to 10.

As will be understood from FIG. 1, substrate 35 moves in direction of an arrow 37 leaving the chamber 2 through an opening 38. As the substrate 35 leaves chamber 2 another substrate 39 to be coated enters chamber 2 through an opening 40 being arranged at the opposite side of the opening 38. Although not shown in FIG. 1, lock chambers can be arranged at both sides of the vacuum chamber 2, so that the substrate 35, coming from a lock chamber being arranged next to the opening 40, moves through the chamber 2 in order to enter another lock chamber being arranged next to the opening 38.

Throughout the coating process a constant vacuum is provided within the chamber 2. This is achieved by vacuum pumps 41, 42 shown in FIG. 1.

Gas reservoirs 43, 44 supply the chamber 2 with a gas or a gas mixture. The gas or the gas mixture flows through a pipe 47, said gas entering the chamber 2 via openings 45, 46 of pipe 47.

The gas or the gas mixture can then be removed by pumps 41, 42, said gas or gas mixture leaving the chamber 2 via openings 48, 49. Each of the gas reservoirs 43, 44 may comprise different gases. For instance, if a reactive sputtering process is carried out, one of the reservoirs 43, 44, for instance reservoir 44, comprises a reactive gas such as $N_2$, $O_2$, whereas the other reservoir 43 comprises an inert gas, such as Ar.

The gas flow can be regulated via valves 50, 51, 52 being controlled by a computer not shown in FIG. 1.

Although four magnetron sputtering sources 7 to 10 are shown in FIG. 1 it is clear to those skilled in the art that there can be arranged more than only four magnetron sputtering sources, but not less than two.

Figure 3:
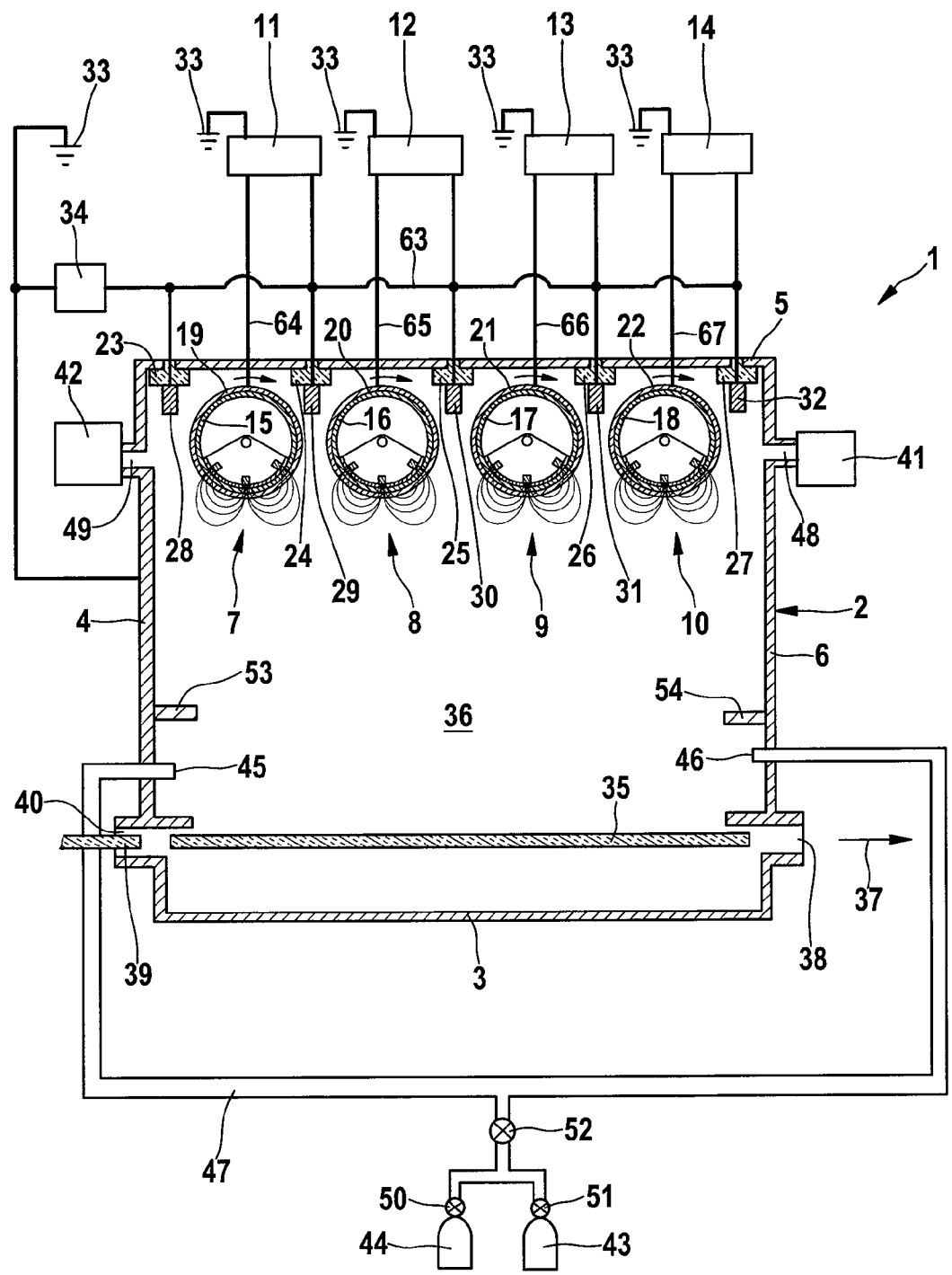
FIG. 3 is a cross section view of an apparatus for coating a substrate, said apparatus comprising tubular cathodes.

As can be seen from FIG. 3 the anodes 29 to 32 are again connected to the respective power supply 11 to 14 and to the other anode 28. All those anodes 28 to 32 are coupled to each other, and the pull-down resistor 34 is arranged between these anodes 28 to 32 and ground 33.

Figure 2:
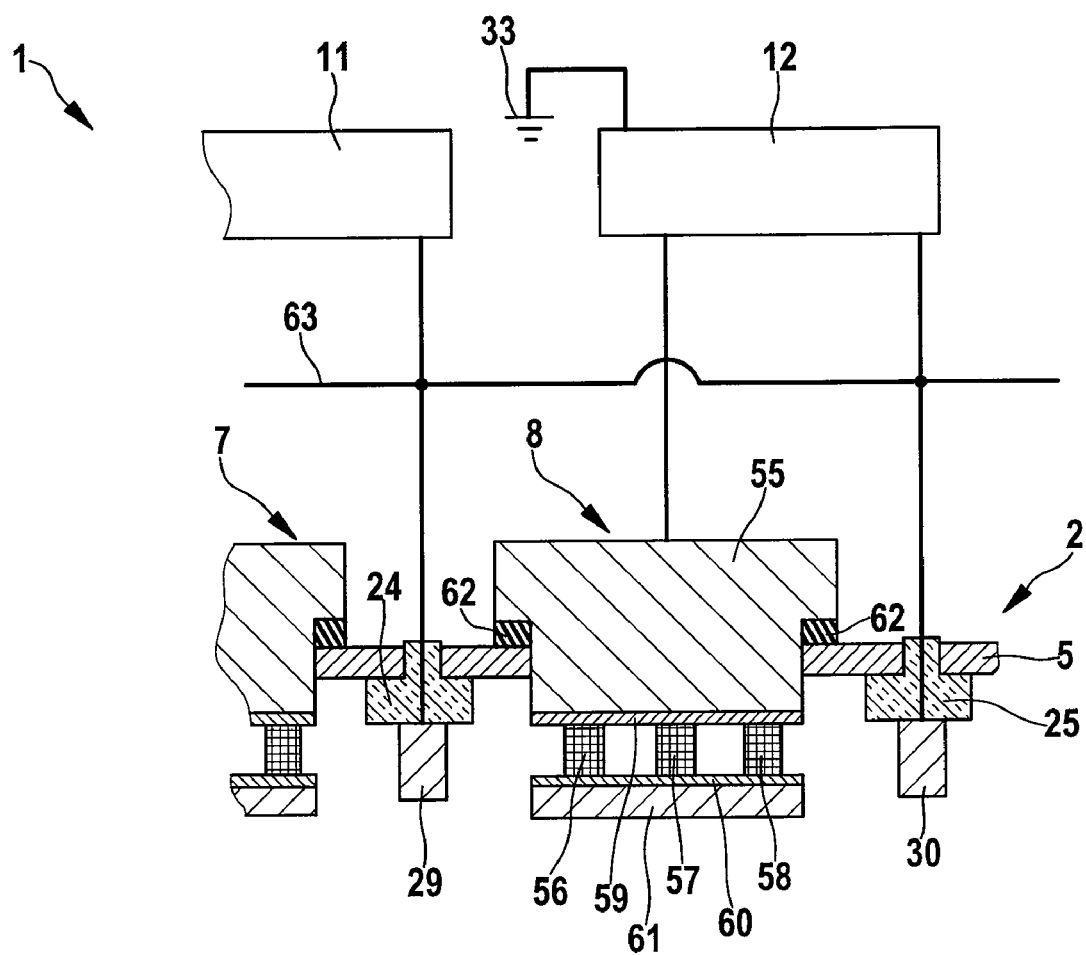
FIG. 2 is a cut-out view of the apparatus according to FIG. 1.

FIG. 2 shows a cut-out of the apparatus 1 according to FIG. 1, illustrating the cathode arrangement 8 and a section of the cathode arrangement 7.

The cathode arrangement 8 and the corresponding anode 30 are connected to the power supply 12. Also, anode 30 is electrically connected to wire or line 63. This power supply 12, a DC power supply, is coupled to ground 33. The cathode arrangement 8 comprises a cathode body 55 being arranged partly in the chamber 2. To maintain a stable vacuum inside the vacuum chamber 2 a sealing 62 is provided.

The cathode arrangement 8 furthermore comprises magnets 56, 57, 58 being arranged on a yoke 59, the yoke 59 being arranged between the magnets 56, 57, 58 and the body 55.

Also a plate 60, preferably a copper plate, is arranged between the magnets 56 to 58 and a target 61, the target material being for instance Mo, Ti, Cu, Si, Al, Zn, Zr, Ni, Cr, NiCr or oxides of these materials. ITO can also be used as a target material.

Although not shown, the cathode arrangement 8 as well as the other cathode arrangements inside the vacuum chamber 2 comprise a cooling device for cooling the cathode arrangement during the coating process.

FIG. 3 shows a similar apparatus as shown in FIG. 1. However, instead of planar cathodes tubular cathodes are provided. Tubular carriers 15 to 18 are surrounded by tubular targets 19 to 22 which are connected to a negative potential of a respective voltage source 11 to 14 via lines 64 to 67. Further details of such tubular cathodes are disclosed by EP 1 722 005 B1. Also, besides linear and tubular cathodes, planar "MoveMag" cathodes as shown in FIG. 2 of DE 197 01 575 A1 may be used.

Figure 4:
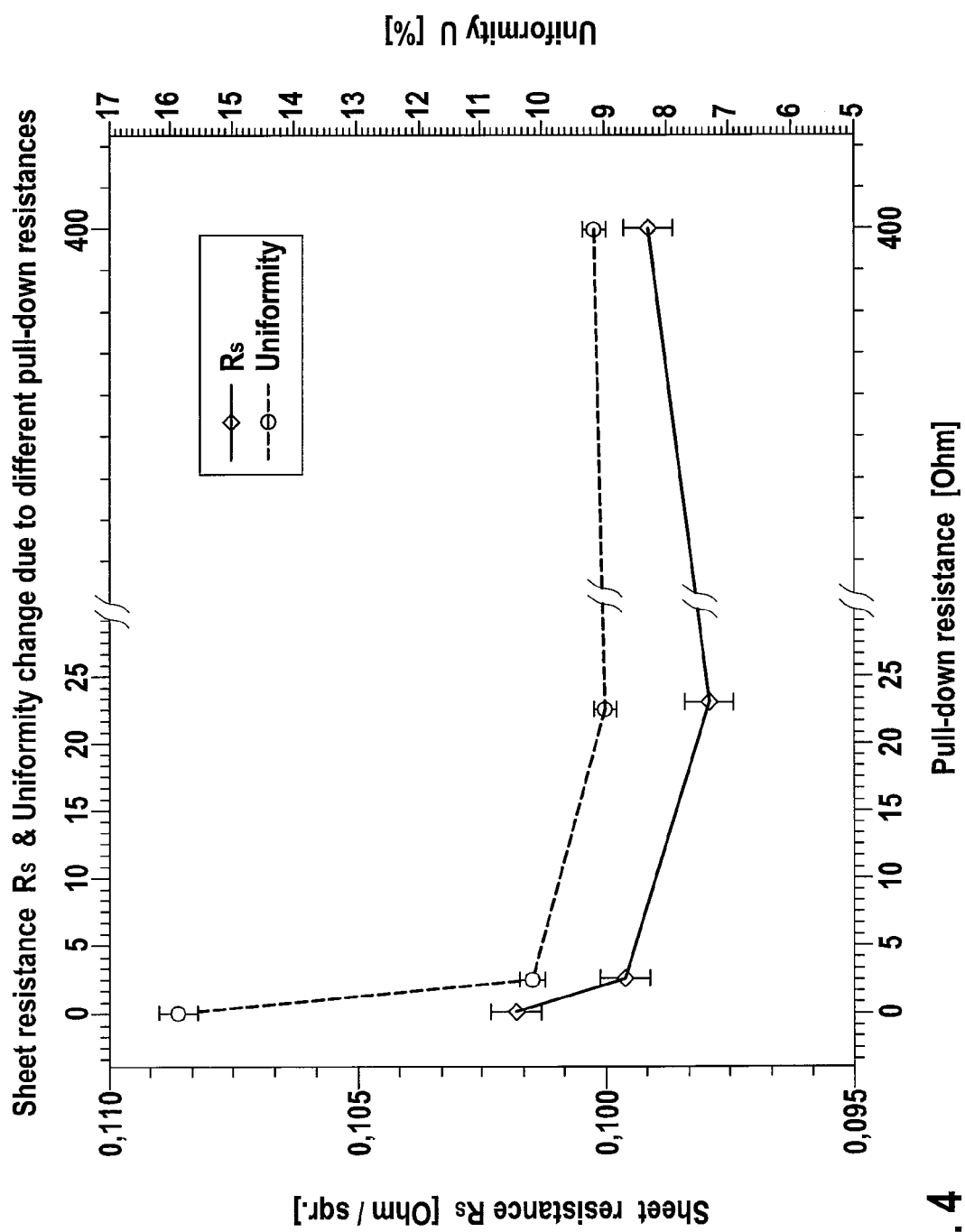
FIG. 4 is a graph showing the sheet resistance of a coating in dependency of different resistance values.

FIG. 4 depicts a graph showing the sheet resistance (Rs), i.e. the resistance of a coating on a substrate and the uniformity of a coating in dependency of different resistance values of a pull-down resistor 34 for a process, wherein the power of one of the cathodes 10 being arranged at one end of the chamber 2 is P=30 kW and the power of the other cathodes 7 to 9 is P=27 kW, the pressure p=0.15 Pa and the layer thickness approximately $d=10^{-7}$ m. The uniformity is determined by $$\text{Uniformity}[\%] = \frac{(\text{Max} - \text{Min})}{(\text{Max} + \text{Min})} \times 100\%$$

wherein Min is the lowest and Max the highest value of the layer thickness d.

The surrounding walls 3 to 6 of the chamber 2 are grounded or earthed to avoid the persons in charge will be hurt by floating potentials and to avoid an electrostatic charging. For the same reason the housings of the power supplies 11 to 14 are grounded. The grounding of the housing is not connected to the anodes 28 to 32.

As can be seen in FIG. 4 there is a lack of uniformity if the resistance values of the pull-down resistor 34 are lower than $2\Omega$. As the resistance values rise above $2\Omega$, the influence on the two characteristics, i.e. sheet resistance and uniformity, decreases, thus providing a pull-down resistor 34 having resistance values beyond $2\Omega$, a more uniform coating can be obtained.

The different powers derive from the position of the cathodes 7 to 10 in the chamber 2. Instead of having different powers being applied to the cathodes, it is also possible to apply only one power to the cathodes.

The break of the curve in FIG. 3 at $R=2\Omega$ is caused substantially by the fact that the measurement comprises three points only. In fact the curve may have the form of an e-function. If the resistor 34 has a value of resistance of 2 k$\Omega$, the effect of the invention is achieved, too. However, the ignition of the cathodes is worse as compared with lower pull-down resistor values.

What is claimed is:

1. Apparatus for coating a substrate comprising:
   1.1 a vacuum chamber (2);
   1.2 n cathodes (7-10) inside said vacuum chamber (2), wherein n$\geq$2, and wherein n is the number of cathodes;
   1.3 at least three anodes (28-32) inside said vacuum chamber (2);
   1.4 a single connecting line (63) to which each of said anodes (28-32) is electrically connected;
   1.5 a resistor (34) being connected to said connecting line (63) at its one end and being connected to ground (33) at its other end, said resistor (34) having a resistance of at least $2\Omega$.

2. Apparatus according to claim 1, characterized in that n cathodes (7-10) and n+1 anodes are provided.

3. Apparatus according to claim 1, characterized in that the vacuum chamber (2) is electrically connected to said ground (33).

4. Apparatus according to claim 1, characterized in that each of the cathodes (7-10) is assigned an anode (29-32), and each of the cathodes (7-10) and its assigned anode (29-32) are connected to a common electrical power source (11-14), so that each of said cathodes (7-10) and assigned anodes (29-32) may be operated electrically independently from the other cathodes and assigned anodes.

5. Apparatus according to claim 1, characterized in that each of the cathodes (7-10) comprises a planar target.

6. Apparatus according to claim 1, characterized in that each of the cathodes (7-10) comprises a cylindrical target.

7. Apparatus according to claim 6, characterized in that the resistor (34) has a resistance of 40$\Omega$ to 10 k$\Omega$.

8. Apparatus according to claim 1, characterized in that shrouds (53, 54) are arranged inside the chamber (2).

9. Apparatus according to claim 1, characterized in that the resistor (34) is a pull-down resistor.

10. Apparatus according to claim 7, characterized in that the resistance of the resistor (34) is between 400 and 500$\Omega$.

11. Apparatus according to claim 1, characterized in that the cathodes are planar cathodes.

12. Apparatus according to claim 1, characterized in that the cathodes are tubular cathodes.

* * * * *